(12) United States Patent
Ashby et al.

(10) Patent No.: US 11,942,282 B1
(45) Date of Patent: *Mar. 26, 2024

(54) THERMALLY SENSITIVE STATE CHANGE IONIC REDOX TRANSISTOR (71) Applicant: National Technology & Engineering Solutions of Sandia, LLC, Albuquerque, NM (US)

(72) Inventors: David Scott Ashby, Livermore, CA (US); Elliot James Fuller, Livermore, CA (US); Albert Alec Talin, Dublin, CA (US); Yiyang Li, Cupertino, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 310 days.

This patent is subject to a terminal disclaimer.

(21) Appl. No.: 17/374,029

(22) Filed: Jul. 13, 2021

(51) Int. Cl.
*G11C 13/00* (2006.01)
*G11C 11/54* (2006.01)
*H01G 9/21* (2006.01)
*H01G 9/22* (2013.01)
*H01G 9/025* (2006.01)
(Continued)

(52) U.S. Cl.
CPC ............... *H01G 9/22* (2013.01); *G11C 11/54* (2013.01); *H01G 9/21* (2013.01); *H01G 9/025* (2013.01); *H01G 9/035* (2013.01); *H01G 9/28* (2013.01)

(58) Field of Classification Search
CPC ............ H01G 9/22; H01G 9/21; H01G 9/025; H01G 9/035; H01G 9/28; G11C 11/54
See application file for complete search history.

(56) References Cited

U.S. PATENT DOCUMENTS 3,990,959 A * 11/1976 Payne .................... B23H 9/16
 205/665
10,429,343 B1  10/2019 Talin et al.
10,497,866 B1  12/2019 Fuller et al.
(Continued)

OTHER PUBLICATIONS

Haile, et al., "Solid acids as fuel cell electrolytes", In Letters to Nature, vol. 410, Apr. 19, 2021, pp. 910-913.
(Continued)

*Primary Examiner* — Min Huang
(74) *Attorney, Agent, or Firm* — Madelynne Farber; Calfee, Halter & Griswold LLP; Samantha Updegraff (57) ABSTRACT

A thermally sensitive ionic redox transistor comprises a channel, a reservoir layer, and an electrolyte layer disposed between the channel and the reservoir layer. A conductance of the channel is varied by changing concentration of ions in the channel layer. The electrolyte layer is configured to undergo a state change at a state transition temperature. Below the state transition temperature, ions in the electrolyte layer are substantially immobile. Above the state transition temperature, ions can move freely between the reservoir layer and the channel across the electrolyte layer in response to a voltage being applied between the channel and the reservoir layer. When the device is cooled below the state transition temperature or temperature range, the ions are trapped in one or more of the layers because the electrolyte layer loses its ionic conductivity. A state of the redox transistor can be read by measuring the conductance of the channel.

20 Claims, 8 Drawing Sheets

(51) Int. Cl.
*H01G 9/035* (2006.01)
*H01G 9/28* (2006.01)

(56) References Cited

U.S. PATENT DOCUMENTS

| | | | |
|---|---|---|---|
| 11,450,802 B1* | 9/2022 | Li | H10N 70/8833 |
| 2002/0037452 A1* | 3/2002 | Schmidt | C22C 30/00 |
| | | | 429/513 |
| 2009/0303773 A1* | 12/2009 | Rinerson | H10N 70/8833 |
| | | | 365/189.011 |
| 2020/0328456 A1* | 10/2020 | Asano | H01M 10/0525 |
| 2021/0074999 A1* | 3/2021 | Imoto | H01M 4/133 |

OTHER PUBLICATIONS

Li, et al., "Filament-Free Bulk Resistive Memory Enables Deterministic Analogue Switching", In Advanced Materials, vol. 32, Issue 45, Sep. 22, 2020, 9 Pages.

* cited by examiner

THERMALLY SENSITIVE STATE CHANGE IONIC REDOX TRANSISTOR

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Neuromorphic computing is an emerging area of computing technology that is well-suited to efficiently perform operations associated with artificial neural networks (ANNs). In theoretical neuromorphic computing devices, analog memory elements both process and store weights associated with neurons and/or synapses in an ANN. While software has been developed to emulate the functionality of ANNs using conventional digital computing devices, these conventional computing devices are not designed for efficient execution of ANNs at a hardware level. Thus, conventional digital computing devices are generally inefficient when executing ANNs relative to theoretical performance of a neuromorphic computing device.

Some analog memory devices have been proposed for use in neuromorphic computers. For instance, Resistive Random-Access Memory (RRAM) and phase change memory (PCM) based on chalcogenide glasses have been proposed for use in neuromorphic computers. RRAM or PCM, however, require large voltages and large currents to program, and are additionally highly unpredictable and nonlinear. For example, it is difficult to program the memory cell into a desired analog state owing to nonuniform heating and electric fields. Additionally, such materials have low channel resistance, drawing micro-amperes of current during read operations per device precluding scaling into large, energy-efficient arrays.

Analog memory devices described in U.S. Pat. Nos. 10,429,343 and 10,497,866 address some of these shortcomings of RRAM and PCM and exhibit substantially linear programming. These devices employ ion transport between an electrochemical gate layer and channel layer to vary conductance of the channel in response to input voltage pulses. However, at micro- and nano-scale, these devices are prone to information loss within only a few seconds after programming, which is believed to be due to charge leakage through electronic switches used to control programming of the devices, which in turn causes ionic migration in the devices.

SUMMARY

The following is a brief summary of subject matter that is described in greater detail herein. This summary is not intended to be limiting as to the scope of the claims.

Various technologies pertaining to a thermally sensitive ionic redox transistor that is suited for analog neuromorphic computing are described herein. In an exemplary embodiment, a thermally sensitive ionic redox transistor comprises a variable-conductance channel, an electrolyte layer disposed in contact with the channel, and a reservoir layer that is disposed in contact with the electrolyte layer, such that the electrolyte layer is positioned between the channel and the reservoir layer. The redox transistor further comprises source and drain contacts that are positioned at opposite ends of the channel, and a gate contact that is positioned on an opposite end of the reservoir layer relative to the electrolyte layer. In exemplary embodiments, the channel and the reservoir layer are composed of materials that are solid within an operational temperature range of the redox transistor.

The electrolyte layer is configured such that the electrolyte layer undergoes a state change at a state transition temperature or within a state transition temperature range. In exemplary embodiments, the electrolyte layer can be configured such that the electrolyte layer has a first physical state below the state transition temperature or state transition temperature range, and has a second physical state above the state transition temperature or state transition temperature range. By way of example, and not limitation, the electrolyte layer can be composed of an ionogel that comprises a solid matrix and an ionic compound. The solid matrix can be a solid both above and below a state transition temperature, whereas the ionic compound can be solid below the state transition temperature but liquid above the state transition temperature (e.g., at standard atmospheric pressure). In other exemplary embodiments, the electrolyte layer comprises a solid acid that undergoes a state transition at a state transition temperature. In still further exemplary embodiments, the electrolyte layer comprises a solid-state cation conductor that undergoes a state change at a state transition temperature.

The ionic conductivity of the electrolyte layer, or at the interface between the electrolyte layer and one or more of the channel layer or the reservoir layer, is dependent on the physical state of the electrolyte layer. For example, the ionic conductivity through the electrolyte layer can be high above a state transition temperature of the electrolyte layer so that above the state transition temperature ions are mobile between the layers. At temperatures below the state transition temperature, the ionic conductivity of the electrolyte layer is low and ions in the electrolyte layer are effectively immobile. Thus, as will be described in greater detail herein, above the state transition temperature, the device can be programmed, and below the state transition temperature, the device retains state for extended periods (e.g., several hours or days with less than 2% change in state value).

The channel is made up of a material that accepts or includes ions that are mobile in the redox transistor under certain operating conditions. As used herein, the term "ions" includes interstitials and vacancies. The reservoir layer is also a material that accepts or includes the same mobile ion as the channel. Electrical conductance of the channel (e.g., conductance of the channel as measured between the source and drain contacts) varies with the concentration of ions in the channel layer. Thus, a "state" of the redox transistor can be defined by the electrical conductance or resistance of the channel layer. A state of the redox transistor can be read by applying a voltage between the source and drain contacts, measuring a resultant current between the source and drain contacts (e.g., through the channel), and computing a conductance or resistance of the channel based upon the applied voltage and the measured current.

The state of the redox transistor can be written by heating the redox transistor above the state transition temperature of the electrolyte layer, and applying a voltage between the reservoir layer and the channel. Below the state transition temperature, ions are substantially immobile in the electrolyte layer, and ions do not migrate when the voltage is applied between the reservoir layer and the channel. However, since ions are mobile in the electrolyte layer above the state transition temperature, ions migrate from the reservoir layer to the channel or vice versa responsive to the voltage being applied. Thus, when the device is heated above the state transition temperature, application of the voltage pulse between the gate contact and at least one of the source or the drain contacts causes ions to move from the reservoir layer to the channel layer (or vice versa) as a result of the flow of electrons between the gate and the source or drain. Therefore, application of a voltage pulse between the gate contact and the source or drain contacts causes substantial changes in the conductance state of the channel layer only when the device is heated above the state transition temperature. The low ionic conductance in the electrolyte layer when the device is below the state transition temperature also prevents information loss of the transistor (e.g., change of electrical conductance of the channel layer between the source contact and the drain contact) when the reservoir layer and the channel layer are electrically shorted (e.g., by shorting the gate contact with either of the source or the drain contacts).

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Various technologies pertaining to a thermally sensitive ionic redox transistor are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

It is to be understood that while certain terminology used herein is in common with conventional transistors (e.g., field-effect transistors, or FETs), including but not limited to the terms gate, source, and drain, such terms are not intended to imply commonality of function between elements of conventional transistors and the thermally sensitive ionic redox transistor described herein. By way of example, and not limitation, unlike various types of conventional transistors, the conductance of a channel of the redox transistor does not depend on a voltage being maintained at a gate electrode during operation of the redox transistor.

Figure 1:
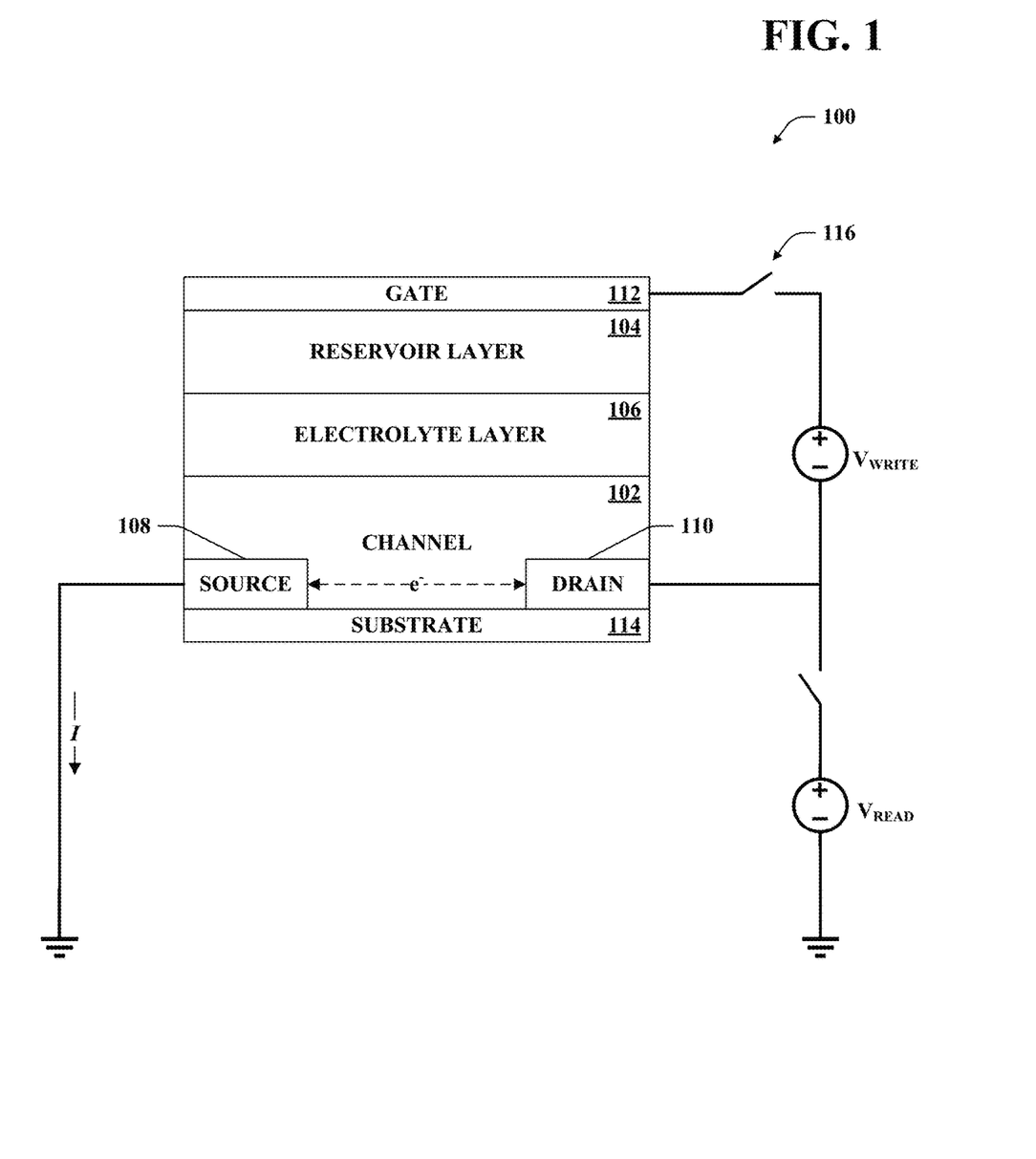
FIG. 1 is a diagram of an exemplary thermally sensitive ionic redox transistor.

With reference now to FIG. 1, an exemplary thermally sensitive ionic redox transistor 100 is illustrated. The redox transistor 100 includes a solid channel layer 102, a solid reservoir layer 104, and an electrolyte layer 106 disposed between the channel layer 102 and the reservoir layer 104. The redox transistor 100 further includes a plurality of contacts 108-112 that facilitate integration of the transistor 100 with other electronic systems. The contacts 108-112 include a source contact 108, a drain contact 110, and a gate contact 112. In exemplary embodiments, the channel layer 102 of the redox transistor 100 can be deposited on a substrate 114. By way of example, the redox transistor 100 can be deposited on a substrate 114 of Si or $SiO_2$ in a CMOS-compatible manufacturing process.

The electrical conductance (or resistance) of the channel 102 between the source 108 and the drain 110 contacts serves as a "state" of the redox transistor 100. As will be explained in greater detail herein, the redox transistor 100 is non-volatile such that for micro- and nano-scale devices, the conductance state of the channel 102 is retained for several hours or days without continued energy input. The conductance of the channel 102 can be varied by a "write" operation and the present conductance of the channel 102 can be measured by way of a "read" operation, as will be described in greater detail below. The redox transistor 100 can further be used as a neuromorphic computing element that applies a weight to a signal input to the redox transistor 100 based on the present conductance state of the redox transistor 100. A current output at one of the source 108 or the drain contacts 110 is a product of the conductance of the channel 102 and a value of a voltage input to the other of the source 108 or the drain 110. Thus, a current output by the redox transistor 100 can be considered a weighted function of the present conductance state of the redox transistor 100.

The channel 102 comprises a mixed ionic and electronic conductor (MIEC) material that has an electrical conductance that varies as a function of the bulk concentration of ions in the channel layer 102. The conductance of the channel 102 can be modulated by transport of ions into and out of the channel 102. The reservoir layer 104 comprises a MIEC material that can readily accept ions from or donate ions to the channel layer 102. In an exemplary embodiment, the channel 102 and the reservoir layer 104 can each comprise a proton injection/extraction material such as, but not limited to, PEDOT:PSS, or $WO_3$. In further exemplary embodiments, the channel layer 102 and the reservoir layer 104 each comprise a transition metal oxide such as, for example (but not limited to) $TiO_x$, or $VO_x$, $WO_x$, $MoO_x$. In such embodiments, each of the channel layer 102 and the reservoir layer 104 are crystalline layers.

Exchange of ions between the channel layer 102 and the reservoir layer 104 occurs by way of the electrolyte layer 106. The electrolyte layer 106 is configured such that the electrolyte layer 106 undergoes a state change as the electrolyte layer 106 is heated or cooled through a state transition temperature or temperature range. In other words, the electrolyte layer 106 is configured such that the electrolyte layer 106 is in a first physical state above a state transition temperature or temperature range, and is in a second physical state below the state transition temperature or temperature range. As used herein supra, reference to a state transition temperature is intended to include a state transition temperature range unless otherwise noted or apparent from context. Furthermore, the electrolyte layer 106 is configured such that the electrolyte layer 106 has an ionic conductivity with respect to ions present in the channel layer 102 and the reservoir layer 104 that is at least 1000 times greater in the first physical state than in the second physical state. In the second physical state (i.e., below the state transition temperature), ionic conductivity is sufficiently low in the electrolyte layer 106 that ions are substantially unable to migrate between the channel layer 102 and the reservoir layer 104. When the redox transistor 100 is heated to a temperature above the state transition temperature of the electrolyte layer 106 such that the electrolyte layer 106 is in the first physical state, the electrolyte layer 106 has sufficiently high ionic conductivity with respect to ions present in the channel layer 102 and the reservoir layer 104 to allow the ions to migrate between the channel 102 and the reservoir layer 104.

From the foregoing, it is to be appreciated that materials used for construction of the channel 102, the reservoir layer 104, and the electrolyte layer 106 can be selected jointly, such that each of the layers 102-106 is capable of accepting, donating, and/or conducting a same ionic species.

The state change of the electrolyte layer 106 from the first physical state to the second physical state or vice versa can be any of various changes in a physical state of the electrolyte layer 106 that affect the ionic conductivity of the material used to form the electrolyte layer 106. In some exemplary embodiments, the state change of the electrolyte layer 106 can be a phase change from a solid in the second physical state to a liquid in the first physical state. For example, the electrolyte layer 106 can be formed as an ionogel that includes a solid matrix in which an ionic compound is suspended. The ionic compound can be a solid below the state transition temperature and a liquid above the state transition temperature. In the solid state of the ionic compound, the ions can be substantially immobile, whereas in the liquid state ion transport and intercalation can occur. The solid matrix in which the ionic compound is suspended can be solid both below and above the state transition temperature. Hence, the electrolyte layer 106 can function macroscopically as a solid both below and above the state transition temperature. In various embodiments, the solid matrix can be composed of silica, PVDF-HFP, or alumina ($Al_2O_3$). In further embodiments, the ionic compound suspended in the solid matrix can include imidazolium-based mineral-acid compounds (e.g., 1-methyl-2-methylimidazolium bromide), 1,2,4-Triazolium perfluorobutanesulfonate, or oxalic acid.

In other embodiments, the state change of the electrolyte layer 106 can be a change in the internal structure of the material used to form the electrolyte layer 106. For example, the state change can be a change from a first crystalline structure to a second crystalline structure, wherein ionic conductivity of the electrolyte layer 106 differs depending upon the crystalline structure of the electrolyte layer 106. In various embodiments, the electrolyte layer 106 can be composed of a solid acid that undergoes a temperature dependent structural change. By way of example, and not limitation, the electrolyte layer 106 can be composed of cesium bisulfate ($CsHSO_4$), potassium phosphate (e.g., monopotassium phosphate, $KH_2PO_4$), or cesium hydrogen selenite ($CsHSeO_4$). In these materials, an internal structural change can form an ionic conduction pathway that allows internal hydrogen ions (i.e., protons) to become highly mobile.

In other embodiments, the electrolyte layer 106 can be composed of a solid-state cation-conductor. Exemplary materials in this category include copper(I) sulfide ($Cu_2S$), materials in the lithium borohydride system ($LiCB_xH_y$, where x and y are integers), or silver iodine (AgI).

Figure 2:
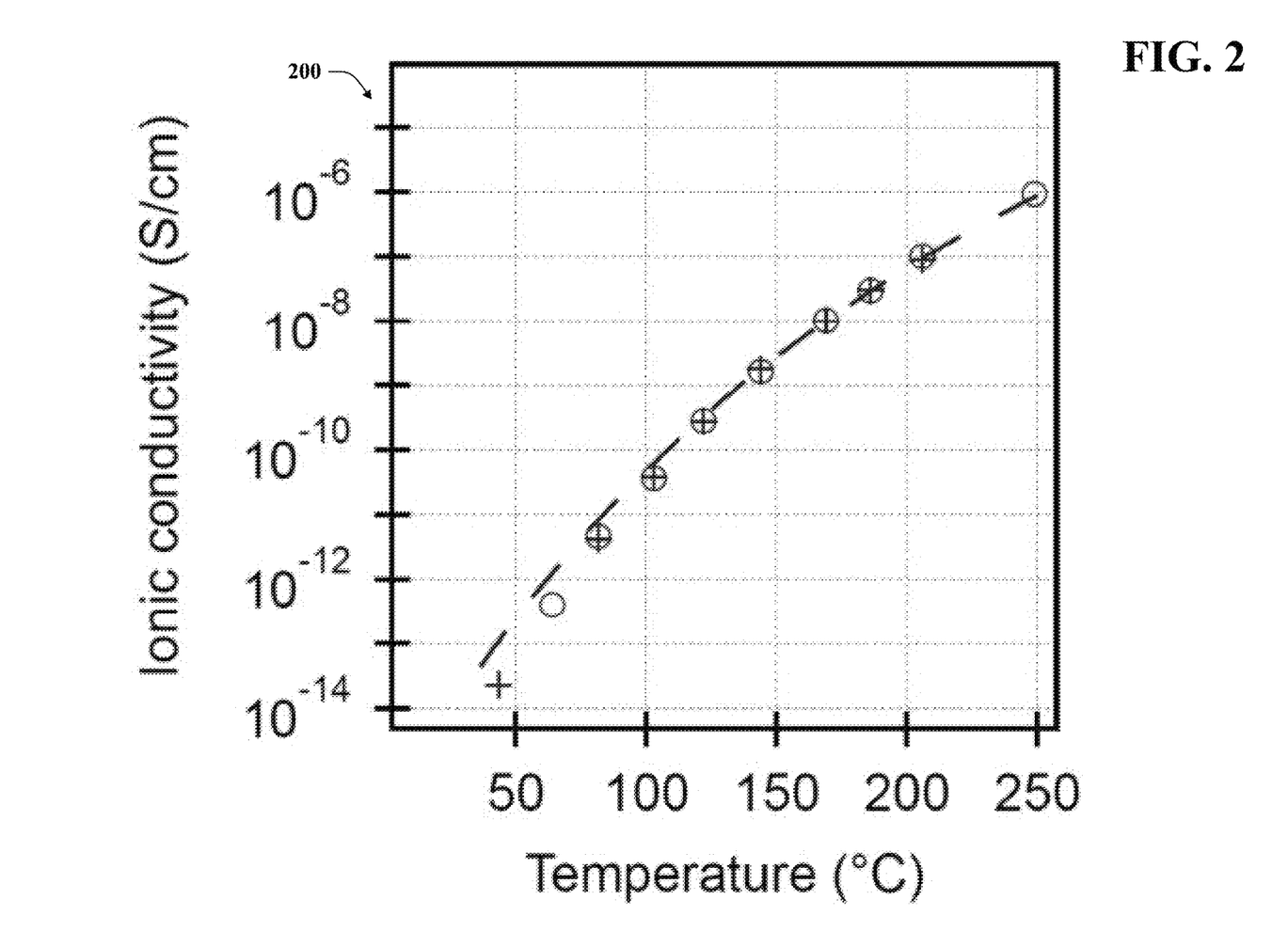
FIG. 2 is a plot of ionic conductivity of yttria-stabilized zirconia (YSZ) versus temperature.

Whereas some materials contemplated for use in a redox transistor, such as yttria-stabilized zirconia (YSZ), have been shown to exhibit temperature-dependent ionic conductivity, these materials have generally exhibited a substantially continuous relationship between ionic conductivity and temperature. For example, and referring now to FIG. 2, a plot 200 of measurements of ionic conductivity of YSZ at temperatures ranging from about 50° C. to about 250° C. is illustrated. As indicated by the plot 200, the ionic conductivity of YSZ increases as temperature increases in a substantially continuous, albeit nonlinear fashion. In YSZ, the ionic conductivity at 25° C. is about $10^{-14}$ S/cm, the conductivity at 90° C. is about $10^{-11}$ S/cm (1000 times higher than room temperature), and the conductivity at 200° C. is about $10^{-7}$ S/cm.

Figure 3:
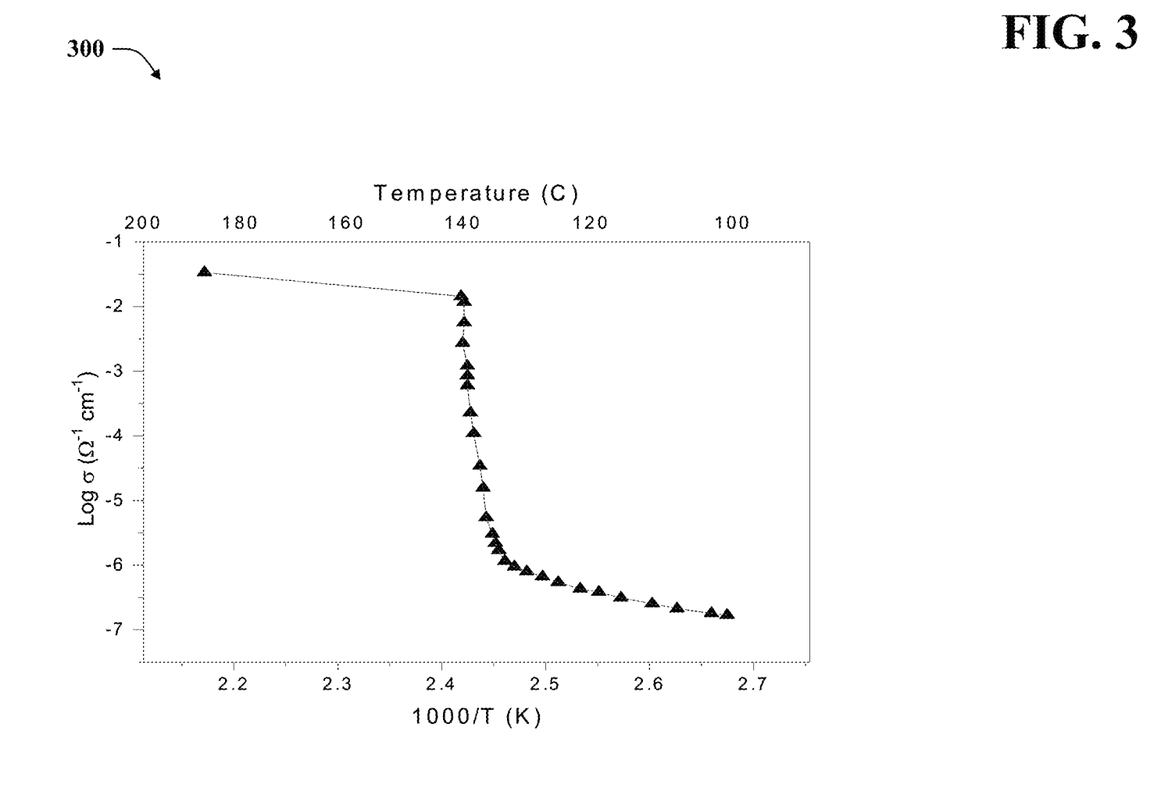
FIG. 3 is a plot of ionic conductivity of cesium bisulfate ($CsHSO_4$) versus temperature.

By contrast, the ionic conductivity of the electrolyte layer 106 in embodiments described herein exhibits a discontinuity at a state transition temperature. For instance, and referring now to FIG. 3, a plot 300 of measurements of ionic conductivity of $CsHSO_4$ at temperatures ranging from about 100° C. to about 185° C. is illustrated. As indicated by the plot 300, the ionic conductivity of $CsHSO_4$ increases by more than four orders of magnitude as temperature increases within a range of about 135° C. to about 140° C. Thus, $CsHSO_4$ exhibits a discontinuous relationship between temperature and ionic conductivity in a state transition temperature range between about 135° C. and about 140° C. (or at a state transition temperature of about 140° C.). In other words, $CsHSO_4$ is substantially non-conducting with respect to hydrogen ions below about 135° C. but is conductive with respect to hydrogen ions above about 140° C. Thus, the electrolyte layer 106 can exhibit behavior similar to a thermally controlled switch.

Discontinuity in the relationship between ionic conductivity and temperature exhibited by various embodiments of the electrolyte layer 106 described herein can provide various advantages to performance of the redox transistor 100. For instance, since the ionic conductivity of the electrolyte layer 106 varies less outside of a narrow state transition temperature range, ion migration between the channel 102 and the reservoir layer 104 of the redox transistor 100 can be less susceptible to variation due to thermal waste of other components with which the transistor 100 may be integrated or packaged. This can inhibit leakage between the channel 102 and the reservoir 104 that can cause loss of information stored in the state of the transistor 100 (e.g., the conductance state of the channel 102). Furthermore, since the temperature change required to transition the electrolyte layer 106 from a non-conducting to a conducting state with respect to ions present in the channel 102 and reservoir layer 104 is smaller than, for example, YSZ, less energy may be needed to heat the transistor 100 when a write operation is performed. For instance, if the electrolyte layer 106 of the transistor is formed from $CsHSO_4$ and the transistor 100 has a normal operating a temperature of about 100° C. (i.e., when a state of the transistor 100 is not being written), a temperature change required to change ionic conductivity of the electrolyte layer 106 by a factor of about $10^5$ is about 40° C., whereas for YSZ FIG. 2 indicates that the necessary temperature change would be greater than 100° C. Still further, in at least some embodiments described herein, above the state transition temperature the ionic conductivity of the electrolyte layer 106 is higher than YSZ at the same temperatures. In at least some embodiments, this can facilitate faster performance of a "write" procedure of the transistor 100, which is described below, as compared to redox transistors that incorporate a YSZ-based electrolyte.

A specific material used to form the electrolyte layer 106 can be selected to have a state transition temperature that lies outside of an expected operating temperature range of a device in which the transistor 100 is intended to be incorporated. For example, many CMOS-based devices such as cell phones, tablet computing devices, and personal computers have operating temperatures ranging from room temperature (e.g., about 20° C.) up to nearly 100° C. In embodiments wherein the transistor 100 is incorporated in a CMOS-based computing device, a material used to form the electrolyte layer 106 of the transistor can be selected to have a state transition temperature that is above 100° C. For example, the electrolyte layer 106 can be formed of $CsHSO_4$, which has a state transition temperature of about 140° C. In various exemplary embodiments, the electrolyte layer 106 is configured to have a first physical state above about 100° C., above about 125° C., or above about 150° C., and a second physical state at a temperature about 10° C. less, e.g., below about 90° C., below about 115° C., or below about 140° C., respectively. In other embodiments, an expected operational temperature of the transistor 100 can be substantially lower than room temperature or substantially higher than 100° C. Thus, substantially any state transition temperature for the electrolyte layer 106 is contemplated as being within the scope of the present disclosure.

In various exemplary embodiments, the electrolyte layer 106 is selected to have an ionic conductivity that is at least $10^3$ times greater, $10^4$ times greater, or $10^6$ times greater in a physical state above the state transition temperature of the electrolyte layer 106 than in a physical state below the state transition temperature. In further embodiments, the electrolyte layer 106 can be selected such that the ionic conductivity is greater than or equal to about $10^{-3}$ S/cm, greater than or equal to about $10^{-2}$ S/cm, or greater than or equal to about $10^{-1}$ S/cm in a physical state above the state transition temperature. In still further embodiments, the electrolyte layer 106 can be selected such that the ionic conductivity in a physical state below the state transition temperature is less than or equal to about $10^{-4}$ S/cm, less than or equal to about $10^{-5}$ S/cm, or less than or equal to about $10^{-6}$ S/cm.

In some embodiments, the channel layer 102 and the reservoir layer 104 can also be configured to have thermally-responsive ionic conductivity. In these embodiments, the channel layer 102 and the reservoir layer 104 are formed of materials that are configured to accept a same ion that is accepted by the electrolyte layer 106. By way of example, and not limitation, the electrolyte layer 106 can be an ionogel that is configured to accept oxygen vacancies, and the channel and reservoir layers 102, 104 can be formed from a material that is configured to accept oxygen vacancies. For example, one or both of the channel layer 102 or the reservoir layer 104 can be formed from strontium titanate (STO) or other material with a perovskite structure that exhibits change in electronic conductivity responsive to changes in oxygen vacancy concentration. These materials further have ionic conductivity with respect to oxygen vacancies that is dependent upon temperature.

A write procedure to modify the conductance state of the redox transistor 100 is now described. Write performance of the redox transistor 100 is substantially linear and symmetric, yielding predictable change of conductance state of the redox transistor 100 without a priori knowledge of the present state of the redox transistor 100. As noted above, the conductance of the channel 102 can be varied by control of transport of ions between the channel 102 and the reservoir layer 104. Migration of ions between the channel 102 and the reservoir layer 104 across the electrolyte layer 106 occurs in response to movement of electrons (i.e., electric current) between the channel 102 and the reservoir layer 104. Accordingly, conductance of the channel 102 can be changed in response to voltage pulses being applied between the reservoir layer 104 and the channel 102 (or between metallic contacts in contact with the reservoir 104 and the channel 102, such as the gate 112 and source 108 contacts, respectively). By way of example, a voltage $V_{WRITE}$ applied between the gate contact 112 and the source contact 108 causes an electric current to flow between the channel 102 and the reservoir layer 104.

However, migration of ions across the electrolyte layer 106 is limited by the ionic conductivity of the layers 102-106 with respect to ions present in the channel layer 102 and the reservoir layer 104. Below a state transition temperature of the electrolyte layer 106, the electrolyte layer 106 is substantially non-conductive (e.g., at least 1000 times less conductive than when the redox transistor 100 is heated above the state transition temperature of the electrolyte layer 106) to ions present in the channel layer 102 and the reservoir layer 104 that are responsible for the electrical conductance of the channel layer 102. Accordingly, at temperatures below the state transition temperature of the electrolyte layer 106, application of voltage pulses at $V_{WRITE}$ will not cause sufficient ion migration between channel layer 102 and reservoir layer 104 to substantially change the conductance state of channel 102. Thus, below the state transition temperature of the electrolyte layer 106, the conductance state of the channel 102 is substantially invariant responsive to voltage pulses at $V_{WRITE}$. The conductance state will not degrade when a switch 116 connected between $V_{WRITE}$ and the gate 112 is leaky (e.g., permits electrical current to flow even when the switch 116 is "open"), or even when switch 116 does not exist and there exists a direct electronic path from the reservoir 104 to the channel 102, because ion migration from the channel 102 to the reservoir layer 104 across the electrolyte layer 106 is effectively blocked when the redox transistor 100 is below the state transition temperature of the electrolyte layer 106.

During a write operation, a change in conductance of the channel 102 exhibits a linear dependence on a number of ions that migrate into or out of the channel 102. A number of ions that migrate into or out of the channel 102 responsive to a voltage pulse applied at $V_{WRITE}$ depends upon a magnitude and duration of the voltage pulse, but also exhibits a linear relationship. Thus, two voltage pulses of equal magnitude and duration cause a substantially same change in conductance of the channel 102. Furthermore, pulses of equal duration and equal but opposite magnitude cause substantially equal but opposite changes in the conductance of the channel 102.

Figure 4:
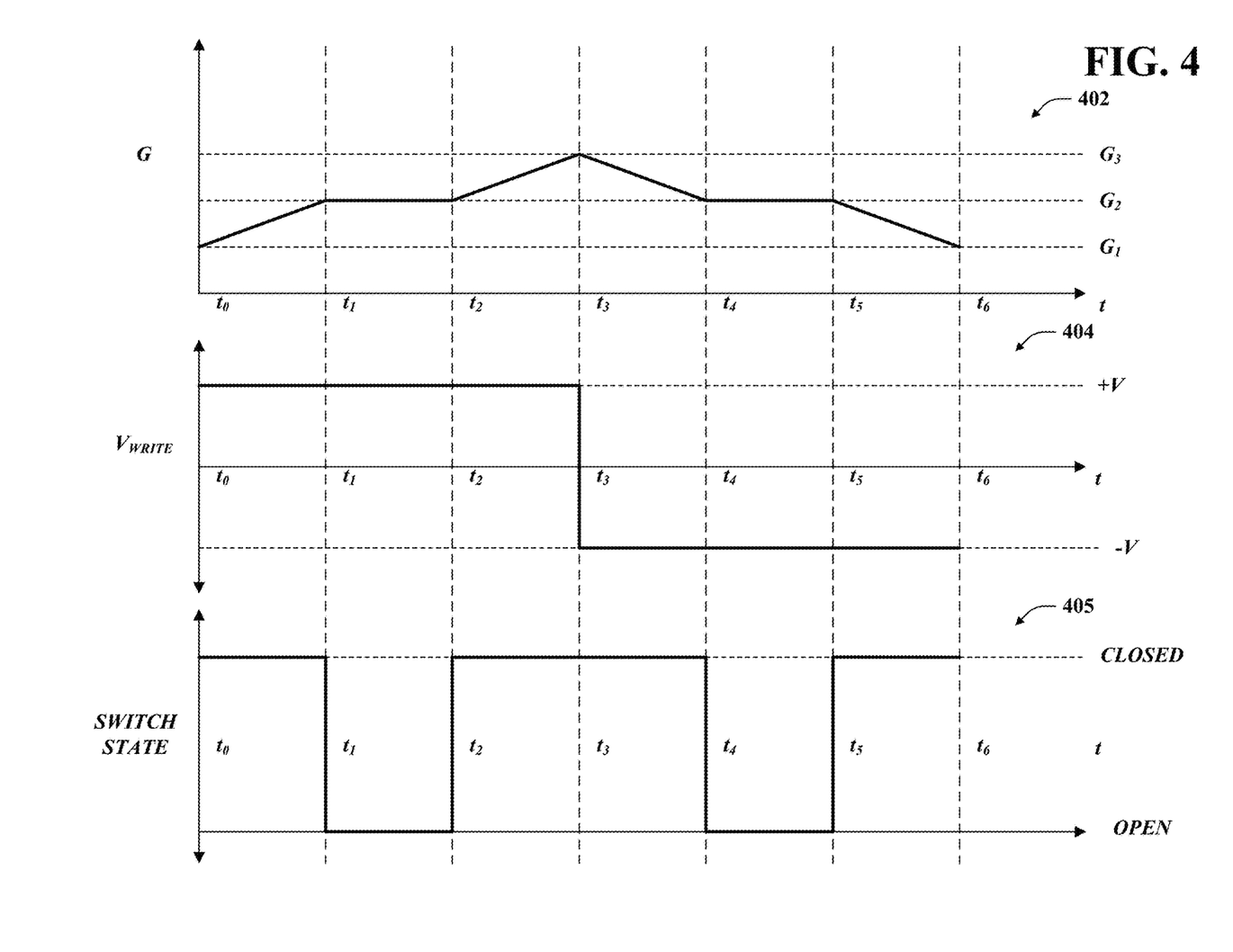
FIG. 4 illustrates corresponding conceptual channel conductance, write-voltage, and switch state diagrams with respect to a thermally-sensitive ionic redox transistor.

To illustrate further, and referring now to FIG. 4, a conceptual channel conductance plot 402, an exemplary $V_{WRITE}$ voltage plot 404, and a plot 405 of a state of the switch 116 are illustrated, which together illustrate certain write performance features of the redox transistor 100 when the redox transistor 100 is heated above the state transition temperature of the electrolyte layer 106. Time is depicted on the x-axis of the plots 402, 404, 405. Conductance G of the channel 102 is depicted on the y-axis of the channel conductance plot 402. The voltage $V_{WRITE}$ that is applied between the gate 112 and the drain 110 is depicted on the y-axis of the $V_{WRITE}$ voltage plot 404. The state of the switch 116, closed or open, is depicted on the y-axis of the switch state plot 405. From time $t_0$ to time $t_1$, the voltage $V_{WRITE}$ takes the value V and the switch 116 is closed, such that there is a drop in electric potential from the reservoir 104 to the channel 102. As a result, in the same period, the conductance of the channel 102, G, undergoes a substantially linear change from $G_1$ to $G_2$ as ions migrate into or out of the channel 102, which direction of migration may depend upon whether the ions are n- or p-type dopants, a material-dependent factor. While the conductance G of the channel 102 is depicted in the plot 402 as increasing in response to a positive value of voltage $V_{WRITE}$, it is to be understood that whether the conductance G increases or decreases in response to a voltage will depend on whether the voltage causes ions to migrate into or out of the channel layer 102. From $t_1$ to $t_2$, the switch 116 is open, and the conductance G does not change. Once a concentration of ions in the channel 102 is set by way of application of a voltage pulse between the source contact 108 and the gate contact 112, the conductance of the channel 102 remains stable until another voltage pulse is applied between the drain 110 and the gate 112. Thus, when no voltage is applied, the conductance of the channel 102 stays constant. From $t_2$ to $t_3$ the voltage $V_{WRITE}$ takes the value V again and the switch 116 is closed, and the conductance G undergoes another substantially linear increase from $G_2$ to $G_3$. Since the same voltage is applied for the same duration, the conductance increase from $G_2$ to $G_3$ is substantially the same magnitude as the conductance increase from $G_1$ to $G_2$ (e.g., ±5%). From $t_3$ to $t_4$, the voltage $V_{WRITE}$ takes the value −V, equal and opposite to the magnitude of the voltage $V_{WRITE}$ from time $t_2$ to $t_3$. In the same period $t_3$ to $t_4$, since the switch 116 is closed, the conductance G undergoes a substantially linear decrease from $G_3$ to $G_2$. Thus, two voltage pulses at $V_{WRITE}$ of the same duration and equal but opposite magnitudes yield conductance changes that cancel one another.

In the period $t_4$ to $t_5$, the conductance G does not change since the switch 116 is open and thus there is no $V_{WRITE}$ applied between the reservoir layer 104 and the channel 102. From $t_5$ to $t_6$, the voltage $V_{WRITE}$ continues to take the value −V and the switch 116 is closed, and thus the conductance G decreases from $G_2$ to $G_1$. As will be understood by those of skill in the art in view of the present disclosure, the change in conductance of the channel 102 resulting from a voltage pulse $V_{WRITE}$ is not substantially dependent on the present conductance state of the channel 102. Furthermore, a conductance change in the channel 102 can be reversed by application of a voltage pulse having opposite polarity to the pulse used to initially cause the conductance change.

The write time required to change the resistance or conductance state of the channel 102 by a given amount can depend at least in part upon the thickness of the electrolyte layer 106 (e.g., where the thickness refers to a thickness of the electrolyte layer 106 between the reservoir layer 104 and the channel layer 102). Thus, in some embodiments the electrolyte layer 106 can be made to be relatively thin (e.g., between 100 nanometers and 1 micron) in order to improve a response time over which the conductance of the channel 102 changes in response to a voltage pulse $V_{WRITE}$.

After the conductance of the channel layer 102 is set to a desired state by way of the write procedure described above, the temperature of the redox transistor 100 can be reduced to a temperature below the state transition temperature of the electrolyte layer 106 in order to reduce ionic conductivity of the electrolyte layer 106 and improve retention of the channel conductance state. Subsequently, the conductance state of the channel layer 102 can be read by applying a voltage $V_{READ}$ between the source 108 and the drain 110, and measuring a current I that flows from the source to the drain. The conductance of the channel 102 can be computed by application of Ohm's law wherein the channel conductance G is equal to $I/V_{READ}$. Thermally-sensitive redox transistors constructed in accordance with the present disclosure can retain state for extended periods (e.g., several hours or several days) below the state transition temperature of a material used to form the electrolyte layer 106.

Figure 5:
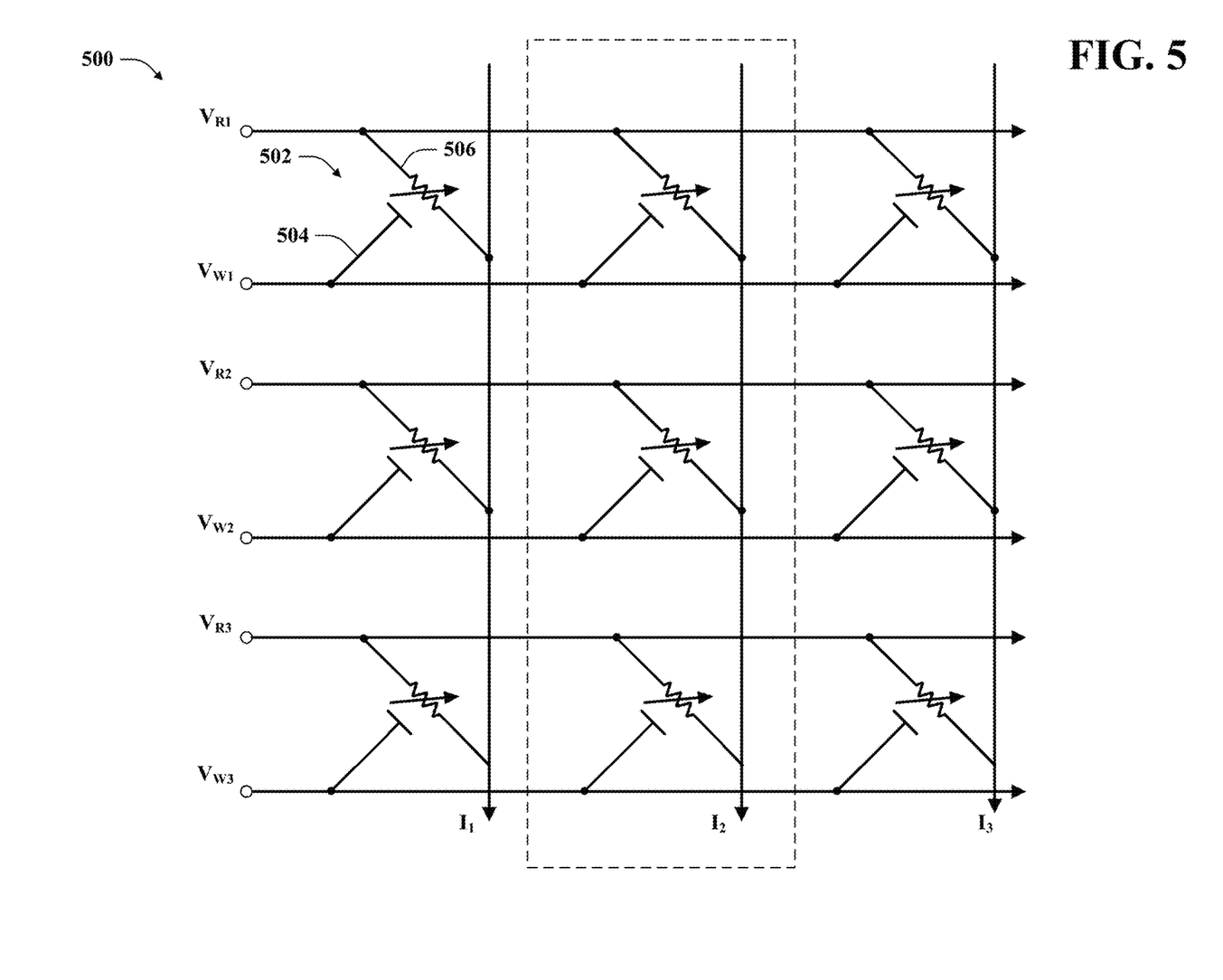
FIG. 5 is a partial circuit diagram of an exemplary crossbar memory device that incorporates a thermally-sensitive ionic redox transistor.
Figure 6:
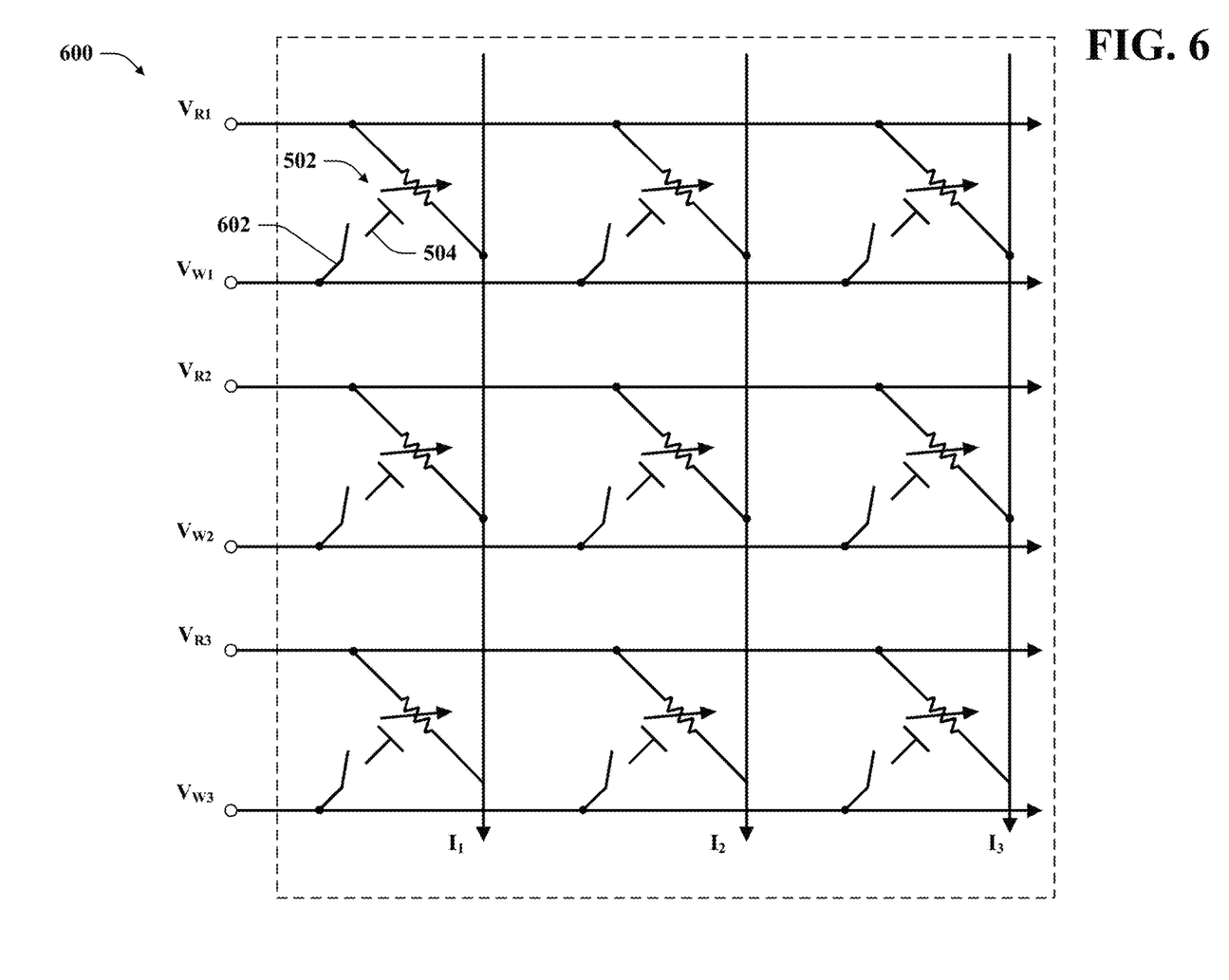
FIG. 6 is a partial circuit diagram of another exemplary crossbar memory device that incorporates a thermally-sensitive ionic redox transistor.

Referring now to FIG. 5, a partial circuit diagram of an exemplary crossbar memory array 500 that incorporates thermally-sensitive ionic redox transistors 502 is shown. The memory array 500 is a 3×3 array addressable by 3 voltage write lines $V_{W1}$-$V_{W3}$ and 3 voltage read lines $V_{R1}$-$V_{R3}$. It is to be understood that while the crossbar memory array 500 shown in FIG. 5 (and similarly, a crossbar memory array 600 shown in FIG. 6) is a 3×3 array, principles described herein are applicable to arrays of substantially any size. The write lines $V_{W1}$-$V_{W3}$ are connected to gate contacts 504 of the redox transistors 502 along rows of the array 500. The read lines $V_{R1}$-$V_{R3}$ are connected to either sources or drains 506 of the redox transistors 502 along rows of the array 500. Current collector lines $I_1$-$I_3$ are connected to the other of the sources or drains 506 along columns of the array 500. Each of the gates 504 of the redox transistors 502 is connected to the same voltage write line as the other redox transistors 502 in its row, either its source or drain 506 is connected to the same voltage read line as the other redox transistors 502 in its row, and the other of its source or drain 506 is connected to the same current collector line as the other redox transistors 502 in its column. A conductance state of a redox transistor 502 in the array 500 can be read by applying a voltage to the voltage read line of the row that corresponds to the redox transistor 502 and measuring the current of the collector line of the column that corresponds to the redox transistor 502. The conductance state can then be determined by an application of Ohm's law given the known write voltage and measured collector line current.

In the crossbar memory array 500, columns of redox transistors 502 can be selectively heated to a temperature above the state transition temperature of the electrolyte layers of the redox transistors 502, one column at a time. An individual redox transistor 502 can therefore be written by heating the column that corresponds to the redox transistor 502 and then applying a write voltage pulse or pulses at the voltage write line of the row that corresponds to the redox transistor 502. Since the state of a redox transistor 502 of the array 500 is only changed when the redox transistor 502 is both heated above the state transition temperature and pulsed at its gate contact 504 by a voltage pulse, heating a single column and energizing a single voltage write line of the array 500 uniquely identifies a single element of the array 500 for a write operation. It is to be understood that in some embodiments, redox transistors of the array 500 can be individually heated (e.g., using Joule heating by way of a resistor array having a corresponding resistor for each element of the array 500), which can save energy.

If a memory array is heated in its entirety rather than selectively, a different means of selecting a redox transistor for writing a conductance state to a single redox transistor in the array can be used. By way of example, and referring now to FIG. 6, a partial circuit diagram of an exemplary crossbar memory array 600 that includes the redox transistors 502 is shown, wherein each of the redox transistors 502 is further addressed for writing by way of a selector switch 602 that is positioned between the gate contact 504 of the redox transistor 502 and its voltage write line (e.g., $V_{W1}$). In the array 600, read operations occur in the same manner as described above with respect to the array 500 of FIG. 5. To perform a write operation with respect to one of the redox transistors 502 of the array 600, the array 600 is heated to a temperature above the state transition temperature of the transistors 502. The voltage write line corresponding to the row of the desirably addressed redox transistor 502 is energized with a desired write voltage. The selector switch 602 of the redox transistor 502 is then closed to apply the write voltage to the gate 504 of the redox transistor 502. In order to simplify addressing of elements in the array 600, selector switches 602 of redox transistors 502 in the same column of the array 600 can be collectively controlled such that switches 602 in the same column of the array 600 are closed and reopened by a single control signal. Thus, to perform a write operation of a redox transistor 502 in the array 600, the voltage write line of the row corresponding to the redox transistor 502 can be energized, and the selector switches of the column corresponding to the redox transistor 502 can be closed.

Figure 7:
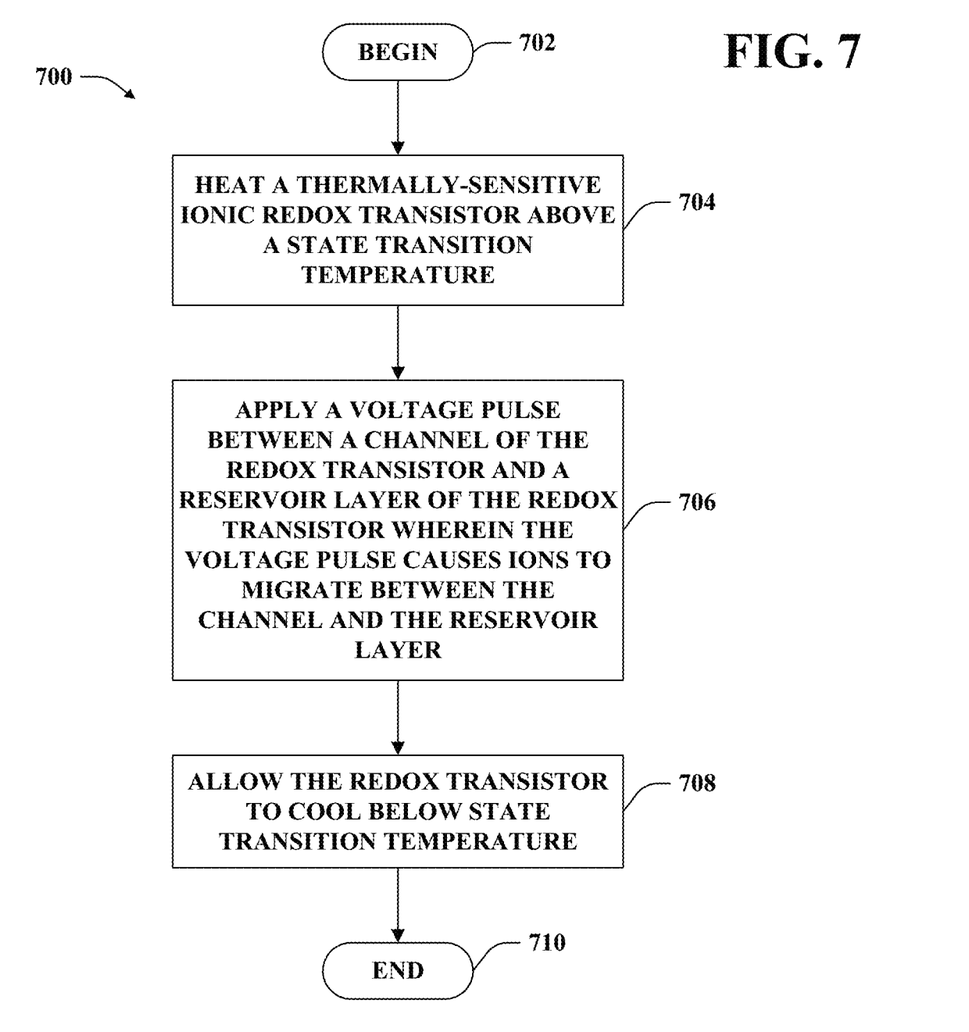
FIG. 7 is a flow diagram that illustrates an exemplary methodology for performing a write operation with respect to a thermally-sensitive ionic redox transistor.
Figure 8:
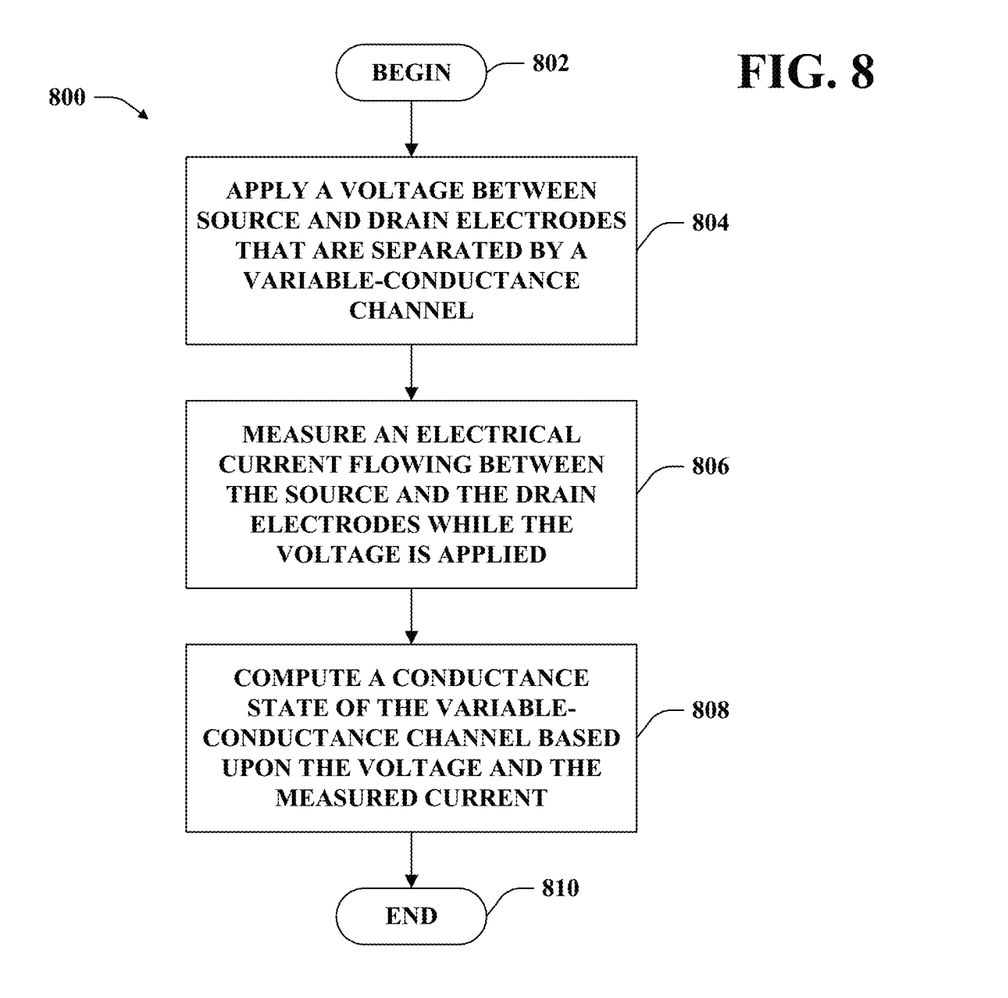
FIG. 8 is a flow diagram that illustrates an exemplary methodology for performing a read operation with respect to a thermally-sensitive ionic redox transistor.

FIGS. 7 and 8 illustrate exemplary methodologies relating to writing and reading conductance states of a thermally-sensitive ionic redox transistor, respectively. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Referring now to FIG. 7, a methodology 700 that facilitates writing a conductance state to a thermally-sensitive ionic redox transistor is illustrated. The methodology 700 begins at 702, and at 704, a thermally-sensitive ionic redox transistor (e.g., the redox transistor 100) is heated to a temperature above the state transition temperature of the redox transistor (e.g., a state transition temperature of an electrolyte layer of the redox transistor). While the redox transistor is above the state transition temperature, at 706, a voltage pulse is applied between a variable-conductance channel of the redox transistor and a reservoir layer of the redox transistor, wherein the voltage pulse causes ions to migrate between the channel and the reservoir layer. The migration of ions in turn causes an increase or decrease in the conductance of the channel layer. The step 706 can be repeated as many times as required to reach a desired conductance state of the channel of the redox transistor. The redox transistor is then allowed to cool or actively cooled to a temperature below the state transition temperature at 708, taking the redox transistor out of a writeable state. The methodology 700 then completes 710.

Referring now to FIG. 8, a methodology 800 that facilitates reading a conductance state of a thermally-sensitive ionic redox transistor (e.g., the redox transistor 100) is illustrated. The methodology 800 begins at 802, and at 804, a voltage is applied between source and drain contacts of the redox transistor, which are separated by a variable-conductance channel. At 806, an electrical current flowing between the source and the drain contacts is measured while the voltage is being applied 804. At 808, a conductance state of the channel of the redox transistor is computed based upon the voltage applied at 804 and the current measured at 806, by application of Ohm's law. The methodology 800 ends at 810.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A device, comprising:
   a solid channel layer having a variable conductance;
   a source coupled to a first side of the solid channel layer;
   a drain coupled to a second side of the solid channel layer;
   a solid reservoir layer;
   an electrolyte layer positioned between the channel layer and the reservoir layer, wherein:
      when a write operation is undertaken on the device, the device is heated to a temperature above a state transition temperature and a write voltage is applied between the channel layer and the reservoir layer, conductivity of the electrolyte layer is increased with respect to ions or vacancies present in at least one of the channel layer or the reservoir layer, the ions or vacancies migrate between the reservoir layer and the channel layer by way of the electrolyte layer, and conductance of the channel layer changes responsive to the ions or vacancies migrating between the reservoir layer and the channel layer; and
      when a read operation is undertaken on the device, a temperature of the device is below the state transition temperature and a read voltage is applied between the source and the drain, where the conductance of the channel layer is substantially invariant when the temperature of the device is below the state transition temperature.

2. The device of claim 1, wherein when the temperature of the device is below the state transition temperature, the electrolyte layer has a conductivity of less than or equal to about $10^{-5}$ S/cm.

3. The device of claim 1, wherein when the temperature of the device is above the state transition temperature, the electrolyte layer has a conductivity of greater than or equal to about $10^{-2}$ S/cm.

4. The device of claim 1, wherein when the temperature of the device is above the state transition temperature, the electrolyte layer has a first conductivity, and wherein the temperature of the device is below the state transition temperature, the electrolyte layer has a second conductivity, the first conductivity being greater than or equal to 1000 times the second conductivity.

5. The device of claim 1, wherein the electrolyte layer comprises:
   a solid matrix; and
   an ionic compound suspended in the solid matrix, wherein the ionic compound undergoes a phase change at the state transition temperature.

6. The device of claim 5, wherein the solid matrix is composed of a material selected from a group consisting of:
   silica;
   poly(vinylidene fluoride-hexafluoropropylene) (PVDF-HFP); and
   alumina.

7. The device of claim 5, wherein the ionic compound is a liquid above the state transition temperature.

8. The device of claim 5, wherein the ionic compound is selected from a group consisting of:
   an imidazolium-based mineral-acid compound;
   1,2,4-Triazolium perfluorobutanesulfonate; and
   oxalic acid.

9. The device of claim 1, wherein the electrolyte layer is composed of a solid acid.

10. The device of claim 9, wherein the electrolyte layer is composed of cesium bisulfate ($CsHSO_4$).

11. The device of claim 9, wherein the electrolyte layer is composed of potassium phosphate.

12. The device of claim 1, wherein the electrolyte layer is composed of a solid-state cation conductor.

13. The device of claim 12, wherein the electrolyte layer is composed of copper(I) sulfide ($Cu_2S$).

14. The device of claim 12, wherein the electrolyte layer is composed of lithium borohydride.

15. The device of claim 1, wherein at least one of the channel layer or the reservoir layer is composed of a material selected from the group consisting of PEDOT:PSS, $VO_x$, $WO_x$, and $MoO_x$.

16. A method, comprising:
   performing a write operation on a device, where performing the write operation comprises:
      heating the device, where the device comprises an electrolyte layer positioned between a reservoir layer and a channel layer that has a variable conductance to a temperature above a state transition temperature, wherein above the state transition temperature the electrolyte layer undergoes a structural state change; and
      applying a write voltage between the reservoir layer and the channel layer while the device is above the state transition temperature, wherein responsive to the write voltage being applied, ions or vacancies migrate between the reservoir layer and the channel layer by way of the electrolyte layer, and wherein the conductance of the channel layer changes responsive to the ions or vacancies migrating between the reservoir layer and the channel layer; and
   performing a read operation on the device, where performing the read operation comprises:
      applying a read voltage between a source and a drain of the device when the device is below the state transition temperature to obtain a value of the conductance of the channel layer, where the source and the drain are coupled to the channel layer, and further where the conductance of the channel layer is substantially invariant when the device is below the state transition temperature and a read voltage is applied between the source and the drain.

17. The method of claim 16, wherein the structural state change is a phase change.

18. The method of claim 16, wherein the structural state change is a change of a crystalline internal structure of the electrolyte layer.

19. An analog memory device comprising:
   a source contact;
   a drain contact;
   a gate contact;
   a channel layer disposed between the source contact and the drain contact, the channel layer having a variable conductance;
   a reservoir layer having the gate contact deposited thereon;
   an electrolyte layer positioned between the channel layer and the reservoir layer, wherein:
      when a write operation is performed on the analog memory device, the analog memory device is heated to a temperature above a state transition temperature of the electrolyte layer and a write voltage is applied between the gate contact and one of the source contact or the drain contact, resulting in ions migrating between the reservoir layer and the channel layer by way if the electrolyte layer, wherein the conductance of the channel layer changes responsive to the ions migrating between the reservoir layer and the channel layer, and
      when a read operation is performed on the analog memory device, the analog memory device has a temperature that is below the state transition temperature of the electrolyte layer and a read voltage is applied between the source contact and the drain contact to obtain a value of the conductance of the channel layer, where the conductance of the channel layer is substantially invariant when the analog memory device has the temperature that is below the state transition temperature of the electrolyte layer.

20. The analog memory device of claim 19, wherein the electrolyte layer comprises:
   a solid matrix; and
   an ionic compound suspended in the solid matrix, wherein the ionic compound undergoes a phase change at the state transition temperature.

* * * * *